US012796379B2

(12) United States Patent
Kinugawa et al.

(10) Patent No.: US 12,796,379 B2
(45) Date of Patent: Nov. 10, 2026

(54) POSITIONAL RELATIONSHIP DETECTION SYSTEM

(71) Applicant: Daifuku Co., Ltd., Osaka (JP)

(72) Inventors: Tomotaka Kinugawa, Hinocho (JP); Koji Kawaguchi, Hinocho (JP)

(73) Assignee: Daifuku Co., Ltd., Osaka (JP)

( * ) Notice: Subject to any disclaimer, the term of this patent is extended or adjusted under 35 U.S.C. 154(b) by 215 days.

(21) Appl. No.: 18/906,200

(22) Filed: Oct. 4, 2024

(65) Prior Publication Data

US 2025/0118581 A1 Apr. 10, 2025

(30) Foreign Application Priority Data

Oct. 6, 2023 (JP) ................................ 2023-174670

(51) Int. Cl.

| | |
|---|---|
| ***H10P 72/00*** | (2026.01) |
| ***B66C 13/46*** | (2006.01) |
| ***B66C 13/48*** | (2006.01) |
| ***H10P 72/30*** | (2026.01) |
| *B66C 19/00* | (2006.01) |

(52) U.S. Cl.

CPC .......... *H10P 72/0606* (2026.01); *B66C 13/46* (2013.01); *B66C 13/48* (2013.01); *H10P 72/3214* (2026.01); *H10P 72/3218* (2026.01); *H10P 72/3221* (2026.01); *B66C 19/00* (2013.01)

(58) Field of Classification Search

CPC ............. H10P 72/0606; H10P 72/3214; H10P 72/3218; H10P 72/3221; H10P 72/3202; H10P 72/3208; H10P 72/3211; B66C 13/46; B66C 13/48; B66C 19/00

See application file for complete search history.

(56) References Cited

U.S. PATENT DOCUMENTS

| | | | | |
|---|---|---|---|---|
| 7,558,645 | B2 | 7/2009 | Shiwaku et al. | |
| 7,581,502 | B2 * | 9/2009 | Nakao | E01B 25/12 104/106 |

FOREIGN PATENT DOCUMENTS

| | | | | |
|---|---|---|---|---|
| JP | 771958 | A | 3/1995 | |
| JP | 2006192549 | A | 7/2006 | |
| JP | 6146537 | B2 | 6/2017 | |
| JP | 2023136464 | A * | 9/2023 | B66C 13/085 |
| WO | WO-2021037526 | A1 * | 3/2021 | G06T 7/70 |

* cited by examiner

*Primary Examiner* — Justin Holmes

(74) *Attorney, Agent, or Firm* — The Webb Law Firm

(57) ABSTRACT

A positional relationship detection system includes a measurement unit that measures a positional relationship, a recording unit that records measurement data obtained by the measurement unit in a time series, and a computation unit. The computation unit acquires target time-series data, which is the time-series data of specific detection target amounts indicating the positional relationship, on the basis of the measurement data recorded by the recording unit. The computation unit identifies a first peak and a second peak that are two of a plurality of peaks of a target oscillation that is the oscillation of the detection target amounts appearing in the target time-series data. The computation unit calculates an average value of detection target amounts included in the target time-series data between the first peak and the second peak as a static detection target amount that is a detection target amount after the target oscillation has ceased.

5 Claims, 6 Drawing Sheets

POSITIONAL RELATIONSHIP DETECTION SYSTEM

CROSS-REFERENCE TO RELATED APPLICATION

This application claims priority to Japanese Patent Application No. 2023-174670 filed Oct. 6, 2023, the disclosure of which is hereby incorporated by reference in its entirety.

BACKGROUND OF THE INVENTION

1. Field of the Invention

The present invention relates to a positional relationship detection system that detects a relative positional relationship between a holding part and a transfer target spot in a transport facility including a transport device that holds and transports a transport object with the holding part, and the transfer target spot at which the transport object is transferred by the transport device.

2. Description of Related Art

An example of the above-described positional relationship detection system is disclosed in Japanese Patent No. 6146537 (JP 6146537). Hereinafter, in the description of the background art, reference numerals in JP 6146537 will be cited in parentheses. The transport facility described in JP 6146537 includes a ceiling traveling vehicle (10) that holds and transports a transport object with a holding part (15), and a load port (3) at which the transport object is transferred by the ceiling traveling vehicle (10). Also, the positional relationship detection system described in JP 6146537 is configured to detect a relative positional relationship between the holding part (15) and the load port (3) by using a teaching unit (20) mounted on the ceiling traveling vehicle (10). Specifically, the actual position of the holding part (15) in a case where the reference position of the load port (3) is set as the origin with the teaching unit (20) disposed above the load port (3), and the turning angle and inclination angle of the holding part (15) with respect to a reference surface of the load port (3), are detected as a detection target amount indicating the positional relationship.

Meanwhile, oscillation may occur in the detection target amount indicating the relative positional relationship between the holding part and the transfer target spot (in JP 6146537, the load port). For example, as described in Paragraph 0028 and FIG. 6 of JP 6146537, in a case where the teaching unit is shaking above the load port, oscillation occurs in the detection target amount. According to JP 6146537, in a case where oscillation occurs in the detection target amount as described above, the detection target amount is capable of being accurately determined by obtaining the center value of the amplitude of the detection target amount.

Although JP 6146537 does not disclose a method for obtaining the center value of the amplitude of the detection target amount, it is conceivable that the center value of the amplitude of the detection target amount is obtained by calculating the time average value of the detection target amounts, for example. However, the time average value may vary depending on a time range over which the average value is obtained. Therefore, simply obtaining the time average value of the detection target amounts may not accurately determine the center value of the amplitude of the detection target amount (in other words, the static detection target amount that is the detection target amount after the oscillation has ceased).

SUMMARY OF THE INVENTION

Thus, it is desirable to realize a technique that easily improves the accuracy of the derived static detection target amount, even in a case where oscillation occurs in the detection target amount indicating the relative positional relationship between the holding part and the transfer target spot.

The positional relationship detection system according to the present disclosure is a positional relationship detection system that detects a relative positional relationship between a holding part and a transfer target spot in a transport facility including a transport device configured to hold a transport object with the holding part to transport the transport object, and the transfer target spot at which the transport object is transferred by the transport device, the positional relationship detection system comprising a measurement unit configured to measure the positional relationship, a recording unit configured to record measurement data obtained by the measurement unit in a time series, and a computation unit, in which the computation unit acquires target time-series data, which is time-series data of specific detection target amounts indicating the positional relationship, on the basis of the measurement data recorded in the recording unit, identifies a first peak and a second peak that are two of a plurality of peaks of a target oscillation that is an oscillation of the detection target amounts appearing in the target time-series data, and calculates an average value of detection target amounts included in the target time-series data between the first peak and the second peak as a static detection target amount that is a detection target amount after the target oscillation has ceased.

According to the present configuration, when the time average value of the detection target amounts is obtained as the static detection target amount, which is the detection target amount after the oscillation of the detection target amount has ceased, the average value is obtained using the target time-series data between the first peak and the second peak as a target. Thus, the number of data points that are skewed to the positive side with respect to the center value of the amplitude and the number of data points that are skewed to the negative side with respect to the center value of the amplitude, which are included in the target time-series data that is a target for obtaining the average value, are capable of being made equivalent (the same or approximately the same). This makes it easier to suppress the bias of the average value of the detection target amounts to the positive or negative side with respect to the center value of the amplitude. Accordingly, it is easier to improve the accuracy of the static detection target amount derived by the computation unit.

Further features and advantages of the positional relationship detection system will become apparent from the following description of an embodiment, which will be described with reference to the drawings.

DESCRIPTION OF THE INVENTION

Figure 1:
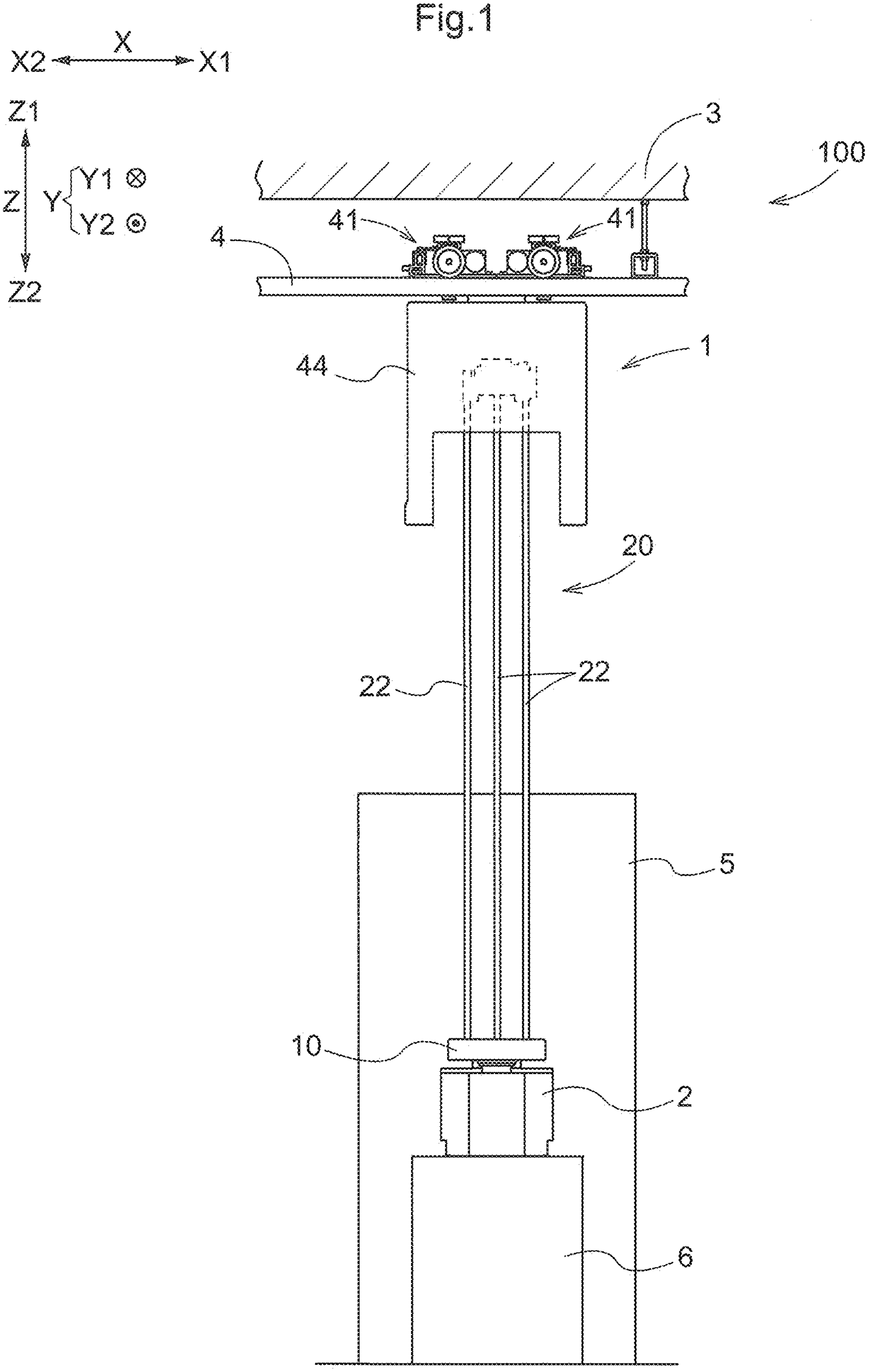
FIG. 1 is a diagram illustrating a transport facility according to an embodiment.

An embodiment of a positional relationship detection system will be described with reference to the drawings. As illustrated in FIG. 3, the positional relationship detection system 50 includes a measurement unit 51, a recording unit 52, and a computation unit 53. In the present embodiment, a detection unit 60 (see FIGS. 4 and 5), which will be described below, provided in the positional relationship detection system 50 includes the measurement unit 51, the recording unit 52, and the computation unit 53. Unlike such a configuration, it is also possible to adopt a configuration in which the measurement unit 51, the recording unit 52, and the computation unit 53 are provided separately in a plurality of hardware components. For example, it is possible to adopt a configuration in which the measurement unit 51 and the recording unit 52 are provided in the detection unit 60, and the computation unit 53 is provided in the transport device 1 (see FIGS. 1 and 2) described below. In this case, for example, the function of the computation unit 53 is realized by a control unit 30 (see FIG. 2) that controls the transport device 1.

The positional relationship detection system 50 is used in transport facility 100 as exemplified in FIG. 1. The transport facility 100 includes a transport device 1 that holds and transports a transport object 2 by a holding part 10, and a transfer target spot 6 where the transport object 2 is transferred by the transport device 1. The positional relationship detection system 50 detects the relative positional relationship between the holding part 10 and the transfer target spot 6 in the transport facility 100. The transport object 2 is, for example, a front opening unified pod (FOUP) that accommodates a semiconductor wafer. In addition, the transfer target spot 6 is, for example, a load port of a processing device 5 that processes the transport object 2 (or the contents accommodated within the transport object 2), an entry/exit port or an entry/exit conveyor of a storage device that stores the transport object 2, or a storage shelf that temporarily stores the transport object 2. The storage shelf is disposed, for example, above (Z1) the load port of the processing device 5.

Hereinafter, a direction along an up-down direction (vertical direction) is referred to as a Z direction, one direction perpendicular to the Z direction is referred to as an X direction, and a direction perpendicular to both the Z direction and the X direction is referred to as a Y direction. Also, one side in the X direction is defined as an X-direction first side X1, and the other side in the X direction is defined as an X-direction second side X2. In addition, one side in the Y direction is referred to as a Y-direction first side Y1, and the other side in the Y direction is referred to as a Y-direction second side Y2. In the present specification, the term "along a (the) direction" is not limited to an aspect parallel to the direction, but also includes an aspect slightly inclined with respect to the direction.

Figure 2:
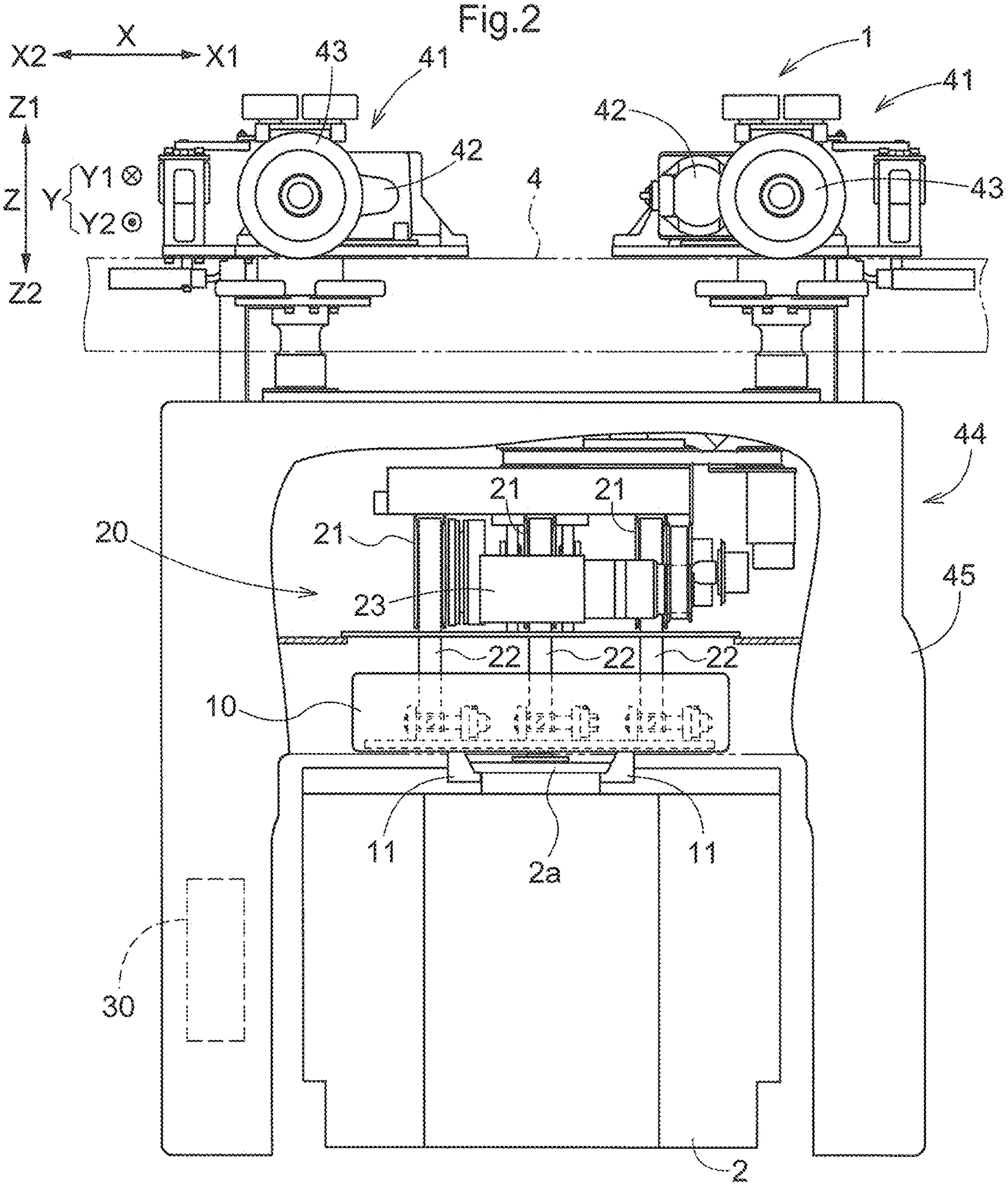
FIG. 2 is a diagram illustrating a transport device according to the embodiment.
Figure 3:
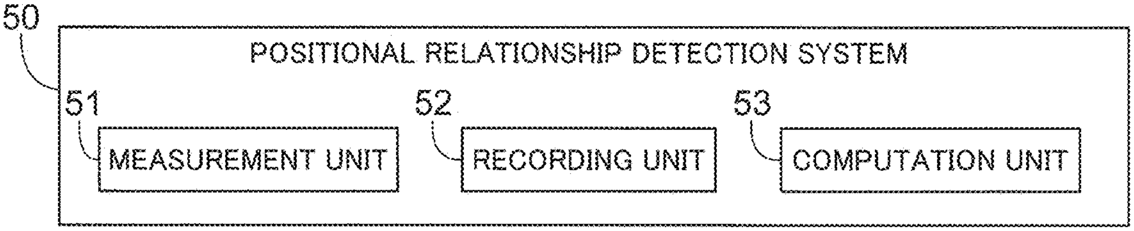
FIG. 3 is a block diagram illustrating a positional relationship detection system according to the embodiment.

The transport device 1 according to the present embodiment illustrated in FIGS. 1 and 2 is configured as follows. The transport device 1 includes a traveling unit 41 that travels along a travel path and a body 44 connected to the traveling unit 41. The body 44 is supported by the traveling unit 41 while disposed below (Z2) the traveling unit 41. The transport object 2 is transported by the transport device 1 while accommodated in the body 44 (specifically, in an internal space of a cover part 45 provided in the body 44).

The travel path along which the traveling unit 41 travels is formed by a rail 4. The traveling unit 41 includes a wheel 43 that rolls on a traveling surface (here, the upper surface) of the rail 4. As the wheel 43 is rotationally driven by a traveling drive motor 42 (for example, an electric motor such as a servo motor), the traveling unit 41 travels along the rail 4. Here, the rail 4 is suspended and supported from a ceiling 3, and the travel path is formed along the ceiling 3. That is, the transport device 1 is a ceiling transport vehicle.

Figure 4:
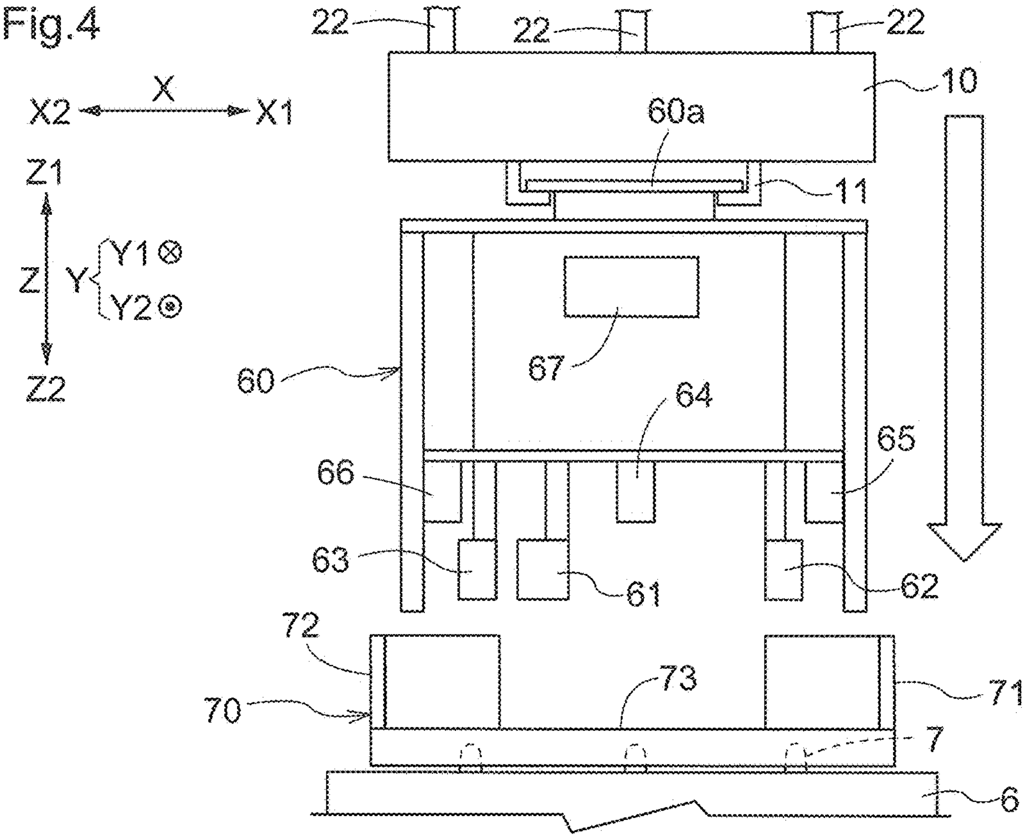
FIG. 4 is a diagram illustrating a detection unit and a detected unit according to the embodiment.
Figure 5:
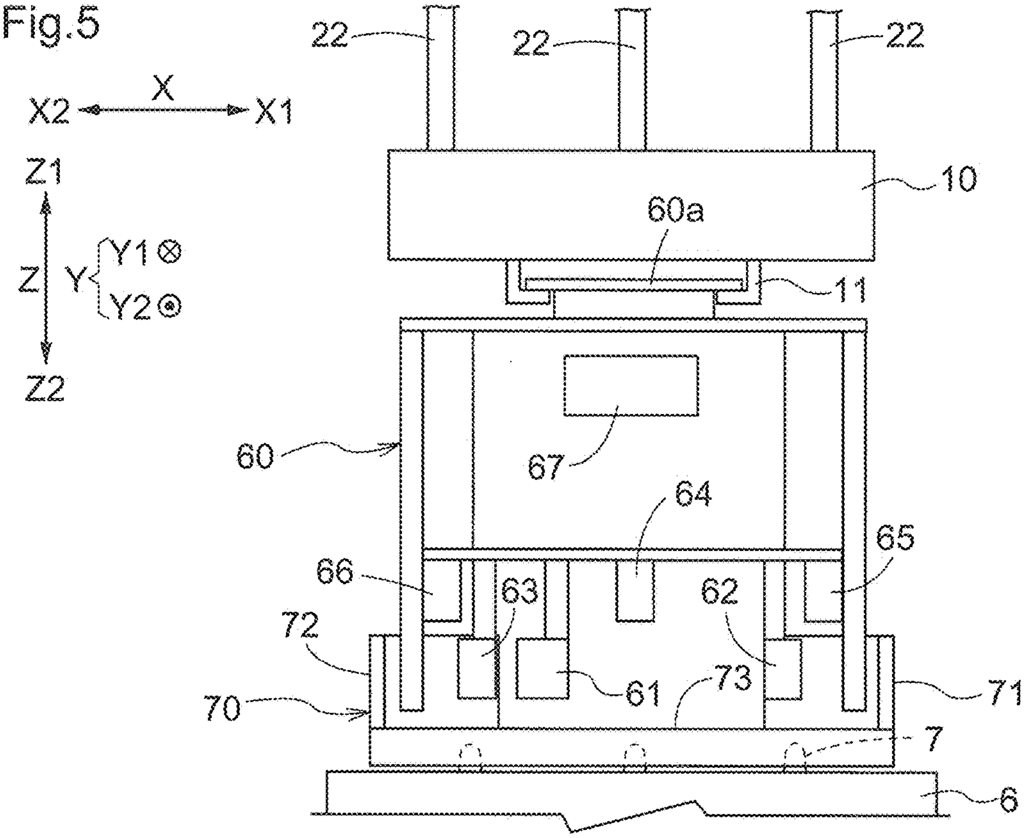
FIG. 5 is a diagram illustrating the detection unit and the detected unit according to the embodiment.

The transport device 1 is configured to transfer the transport object 2 to the transfer target spot 6 by lowering the holding part 10 (specifically, the holding part 10 holding the transport object 2) toward the transfer target spot 6. As illustrated in FIGS. 4 and 5, a positioning mechanism 7 that engages with a lower part of the transport object 2 to position the transport object 2 is provided at the transfer target spot 6. The transport object 2, transferred from the holding part 10 to the transfer target spot 6 is disposed at the transfer target spot 6 while positioned by the positioning mechanism 7. In FIG. 1, the positioning mechanism 7 is not illustrated.

In the examples illustrated in FIGS. 4 and 5, the positioning mechanism 7 is configured to engage with a bottom portion of the lower part of the transport object 2 to position the transport object 2. Specifically, the positioning mechanism 7 includes a kinematic pin that engages with a recessed portion (for example, a groove-shaped recessed portion) (not illustrated) formed at the bottom portion of the transport object 2 and is configured to position the transport object 2 by engaging the kinematic pin with the recessed portion. The configuration of the positioning mechanism 7 is not limited to this, and it is also possible to adopt, for example, a configuration in which the positioning mechanism 7 engages with an outer edge of the lower part of the transport object 2 to position the transport object 2.

The transport device 1 includes a lifting and lowering device 20 that lifts and lowers the holding part 10. The configuration of the lifting and lowering device 20 is not limited to this, but in the present embodiment, the lifting and lowering device 20 is configured as follows. As illustrated in FIG. 2, the lifting and lowering device 20 includes a rotating body 21 (for example, a drum), a windable member 22 (for example, a belt or a wire) that is wound around the rotating body 21 to be freely wound and unwound, and a lifting and lowering drive motor 23 (for example, an electric motor such as a servo motor) that rotationally drives the rotating body 21. The lifting and lowering device 20 is configured to lift and lower the holding part 10 by winding and unwinding the windable member 22 through the rotation of the rotating body 21, with the holding part 10 suspended by the windable member 22. Specifically, the lifting and lowering device 20 lifts the holding part 10 by winding the windable member 22 and lowers the holding part 10 by unwinding the windable member 22.

In a case where the transport device 1 performs a traveling operation of traveling along the travel path, the holding part 10 is disposed at a traveling height. Here, the traveling height refers to the height at which the transport object 2, held by the holding part 10, is accommodated in the body 44 (see FIG. 2). In a case where the transport object 2 is transferred between the holding part 10 and the transfer target spot 6, the holding part 10 is disposed at a transfer height. The transfer height is a height corresponding to the transfer target spot 6 (see FIG. 1) and is set according to the height of the transfer target spot 6.

As illustrated in FIGS. 1 and 2, the holding part 10 is configured to hold the transport object 2 from above (Z1). Specifically, the holding part 10 holds the transport object 2 by supporting a flange portion 2*a* formed on the upper portion of the transport object 2 with a support member 11. The transport device 1 includes a holding drive motor (for example, an electric motor such as a servo motor) (not illustrated) that drives the holding part 10. A holding operation of holding the transport object 2 and a holding release operation of releasing the holding of the transport object 2 are performed by driving the holding part 10 with the holding drive motor. In the example illustrated in FIG. 2, the holding drive motor is configured such that the pair of support members 11 is brought close to and separated from each other. Then, the holding operation by the holding part 10 is performed by bringing the pair of support members 11 close to each other, and the holding release operation by the holding part 10 is performed by separating the pair of support members 11 from each other. The holding operation and the holding release operation are performed with the holding part 10 disposed at the transfer height.

Although not illustrated, the transport device 1 may include an adjustment device that adjusts at least one of the position of the holding part 10 in a horizontal direction, the rotation position of the holding part 10 about a vertical axis along the Z direction, or the inclination angle of the holding part 10 with respect to the horizontal plane. For example, the adjustment device may be configured to include either or both a moving device that moves the holding part 10 in a width direction and a rotating device that rotates the holding part 10 about the vertical axis. Here, the width direction is a horizontal direction perpendicular to a traveling direction of the transport device 1. In the examples illustrated in FIGS. 1 and 2, the X direction is the traveling direction, and the Y direction is the width direction.

The moving device is configured, for example, to move the holding part 10, which is supported by the lifting and lowering device 20, in the width direction by moving the lifting and lowering device 20 in the width direction. The rotating device is configured to, for example, rotate the lifting and lowering device 20 about the vertical axis to rotate the holding part 10 supported by the lifting and lowering device 20 about the vertical axis. In a case where the transfer target spot 6 is disposed at a position deviating from the travel path of the transport device 1 in a plan view (viewed in the Z direction), the transport device 1 moves the holding part 10 in the width direction with the moving device to a position overlapping the transfer target spot 6 in the plan view and then, lowering the holding part 10 toward the transfer target spot 6 to transfer the transport object 2 to the transfer target spot 6.

As illustrated in FIG. 2, the transport device 1 includes a control unit 30 that controls the operation of the transport device 1. The control unit 30 controls the traveling drive motor 42 to cause the traveling unit 41 to perform the traveling operation along the travel path. In addition, the control unit 30 controls the lifting and lowering drive motor 23 to cause the lifting and lowering device 20 to perform the lifting and lowering operation of lifting and lowering the holding part 10. The lifting and lowering operation includes a lifting operation of lifting the holding part 10 and a lowering operation of lowering the holding part 10. In addition, the control unit 30 controls a holding drive motor (not illustrated) to cause the holding part 10 to perform the holding operation and the holding release operation. The control unit 30 includes, for example, a computation processing device such as a CPU and peripheral circuits such as memory. Each function of the control unit 30 is realized through the cooperation of this hardware and a program executed on the hardware, such as the computation processing device.

In a case where the transport object 2 is transferred between the holding part 10 and the transfer target spot 6, the control unit 30 causes the traveling unit 41 to perform the traveling operation of causing the transport device 1 to travel to a target stop position corresponding to the transfer target spot 6, with the holding part 10 disposed at the traveling height. The target stop position is set to the same position as the transfer target spot 6 in the traveling direction (the X direction in the examples illustrated in FIGS. 1 and 2). Then, in a case where the transport object 2 is transferred from the holding part 10 to the transfer target spot 6, the control unit 30 causes the lifting and lowering device 20 to perform the lowering operation of lowering the holding part 10 holding the transport object 2 from the traveling height to the transfer height, then causes the holding part 10 to perform the holding release operation of the transport object 2, and then causes the lifting and lowering device 20 to perform the lifting operation of lifting the holding part 10, which does not hold the transport object 2, from the transfer height to the traveling height. In addition, in a case where the transport object 2 is transferred from the transfer target spot 6 to the holding part 10, the control unit 30 causes the lifting and lowering device 20 to perform the lowering operation of lowering the holding part 10, which does not hold the transport object 2, from the traveling height to the transfer height, then causes the holding part 10 to perform the holding operation of the transport object 2, and then causes the lifting and lowering device 20 to perform the lifting operation of lifting the holding part 10, which holds the transport object 2, from the transfer height to the traveling height.

The target stop position where the transport device 1 is stopped in a case where the transport object 2 is transferred between the holding part 10 and the transfer target spot 6, and a target operation amount for operating the holding part 10 in a case where the transport object 2 is transferred between the holding part 10 and the transfer target spot 6, are set so that the transport object 2 is capable of being appropriately transferred. The control unit 30 acquires setting values for the target stop position and the target operation amount by referring to a memory device (for example, a memory device provided in the transport device 1) or similar means, and causes the transport device 1 to perform the transfer operation of the transport object 2. The target operation amount of the holding part 10 includes, for example, the target lifting and lowering amount of the holding part 10 by the lifting and lowering device 20, or the adjustment amount (for example, the target movement amount of the holding part 10 by the moving device, or the target rotation amount of the holding part 10 by the rotating device) of the holding part 10 by the adjustment device described above.

The above target stop position and target operation amount are set during the introduction of the transport facility 100. In addition, to prevent the transport object 2 from being incapable of being appropriately transferred due to aging or the like, the target stop position and the target operation amount are generally adjusted and updated through regular inspections or the like. The target stop position and target operation amount are capable of being set or updated on the basis of the detection results of the relative positional relationship between the holding part 10 and the transfer target spot 6 by the positional relationship detection system 50. That is, the positional relationship detection system 50 is capable of acquiring the deviation amount of the position of the holding part 10 from the target position (the ideal position for transferring the transport object 2 to the transfer target spot 6) and is capable of performing the teaching of adjusting the target stop position and the target operation amount so that the deviation amount is reduced. Hereinafter, the configuration of the positional relationship detection system 50 according to the present embodiment will be described.

As described above, the positional relationship detection system 50 includes the measurement unit 51, the recording unit 52, and the computation unit 53. The recording unit 52 records the measurement data obtained by the measurement unit 51 in a time series. The recording unit 52 includes a storage medium (for example, a flash memory) capable of storing and rewriting information. The recording of the measurement data in the recording unit 52 is performed by the computation unit 53. The computation unit 53 includes, for example, a computation processing device such as a CPU and peripheral circuits such as memory. Each function of the computation unit 53 is realized through the cooperation of this hardware and a program executed on the hardware, such as the computation processing device.

The measurement unit 51 measures the relative positional relationship (hereinafter, may be simply referred to as a "positional relationship") between the holding part 10 and the transfer target spot 6. The position where the holding part 10 is disposed during the transfer of the transport object 2 between the holding part 10 and the transfer target spot 6 (in the present embodiment, the position where the holding operation or the holding release operation is performed by the holding part 10) is referred to as the "transfer position," and the measurement of the positional relationship by the measurement unit 51 is performed, for example, with the holding part 10 disposed at a position (either the transfer position or a position set with reference to the transfer position but different from the transfer position) corresponding to the transfer position. In the present embodiment, the positional relationship is measured by the measurement unit 51, with the transport device 1 positioned at the aforementioned target stop position and the holding part 10 positioned at a target height (either the transfer height described above or a height set with reference to the transfer height but different from the transfer height) set according to the height of the transfer target spot 6. The target height is set, for example, to a height above (Z1) by a set height with respect to the transfer height.

As illustrated in FIGS. 4 and 5, in the present embodiment, the positional relationship detection system 50 includes a detection unit 60 and a detected unit 70. The measurement unit 51, the recording unit 52, and the computation unit 53 are provided in the detection unit 60. One of the detection unit 60 and the detected unit 70 is held by the holding part 10 instead of the transport object 2, while the other of the detection unit 60 and the detected unit 70 is disposed at the transfer target spot 6. One of the detection unit 60 and the detected unit 70, which is held by the holding part 10, is configured such that, for example, the weight and the center-of-gravity position are equivalent to those of the transport object 2. Here, the term "equivalent" means that it is sufficient to perform the same function, and does not need to be completely identical.

As illustrated in FIGS. 4 and 5, in the present embodiment, the detection unit 60 is held by the holding part 10, and the detected unit 70 is disposed at the transfer target spot 6. Specifically, the holding part 10 holds the detection unit 60 by supporting a supported portion **60*a*, which is formed on the upper portion of the detection unit 60, with the support member 11. The shape of the supported portion 60*a* is, for example, a shape corresponding to the flange portion 2*a* (see FIG. 2) of the transport object 2. The detected unit 70 is disposed at the transfer target spot 6 while positioned by the positioning mechanism 7. In the examples illustrated in FIGS. 4 and 5, the kinematic pin provided in the positioning mechanism 7 engages with a recessed portion (not illustrated) formed in the bottom portion of the detected unit 70, thereby positioning the detected unit 70 with respect to the transfer target spot 6**.

The measurement unit 51 measures the relative positional relationship between the detection unit 60 and the detected unit 70, thereby measuring the relative positional relationship between the holding part 10 holding the detection unit 60 and the transfer target spot 6 where the detected unit 70 is disposed. FIG. 4 illustrates a state in which the holding part 10 holding the detection unit 60 is lowered, with the detected unit 70 disposed at the transfer target spot 6. FIG. 5 illustrates a state in which the holding part 10 holding the detection unit 60 is lowered to the aforementioned target height. In this state, the measurement unit 51 measures the positional relationship. The target height is set to a height where the detection unit 60 and the detected unit 70 do not come into contact with each other, as illustrated in FIG. 5.

Figure 6:
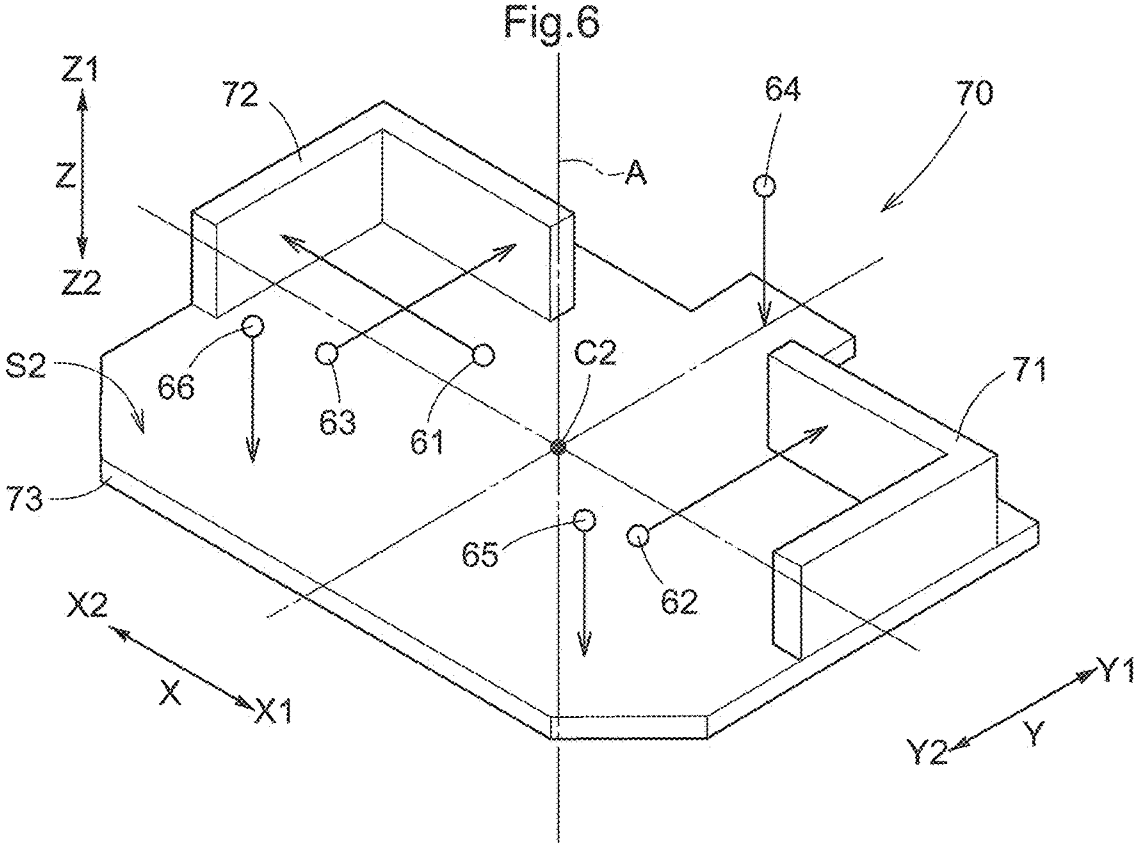
FIG. 6 is a perspective view of the detected unit according to the embodiment.

As illustrated in FIG. 6, the detected unit 70 includes a plate-shaped portion 73 formed in a plate shape, and two wall portions (a first wall portion 71 and a second wall portion 72) provided on an upper surface (a surface above (Z1)) of the plate-shaped portion 73. The recessed portion with which the above-described kinematic pin engages is formed on an lower surface (a surface below (Z2)) of the plate-shaped portion 73. The first wall portion 71 is disposed on the X-direction first side X1 of the plate-shaped portion 73, and the second wall portion 72 is disposed on the X-direction second side X2 of the plate-shaped portion 73.

Here, a reference surface of the transfer target spot 6 is referred to as a "target reference surface S2". The target reference surface S2 is a surface (plane) set with reference to the transfer target spot 6. For example, the upper surface of the transfer target spot 6, which is a placement surface on which the transport object 2 is placed, may be the target reference surface S2. As long as a surface set with reference to the transfer target spot 6 is provided, a surface away from the transfer target spot 6 or an imaginary surface may be used as the target reference surface S2. Although the transfer target spot 6 is omitted in FIGS. 6 to 9, in the present embodiment, as illustrated in FIGS. 6 to 9, the upper surface of the detected unit 70 disposed on the transfer target spot 6 (an example of a surface away from the transfer target spot 6) is used as the target reference surface S2. The target reference surface S2 is designed to be a horizontal plane.

Figure 8:
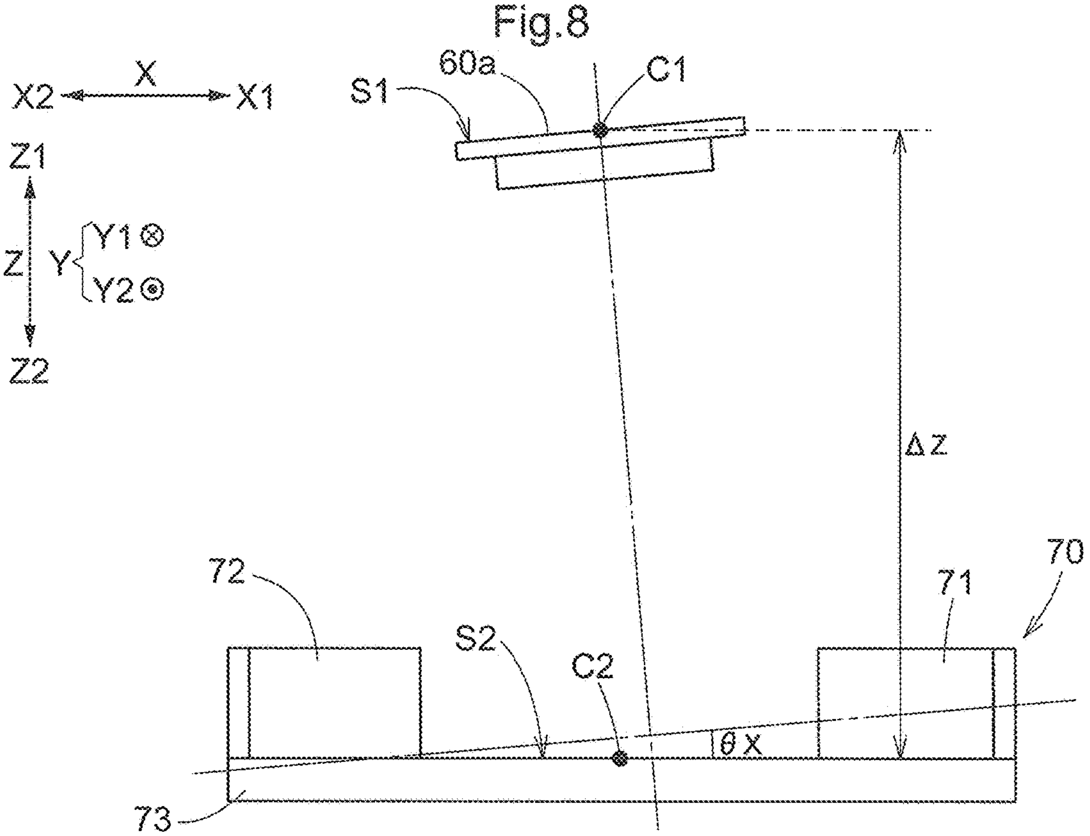
FIG. 8 is an explanatory diagram of a Z-direction distance and an X-direction inclination angle.
Figure 9:
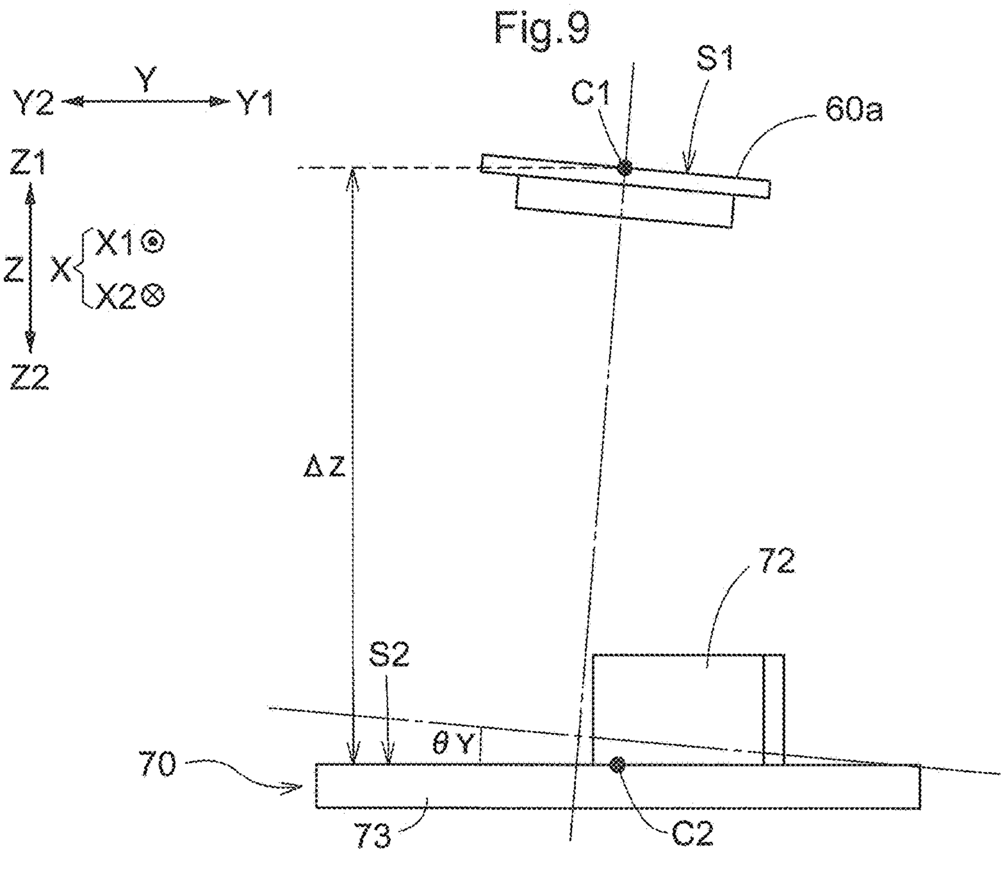
FIG. 9 is an explanatory diagram of the Z-direction distance and a Y-direction inclination angle.

In addition, the reference surface of the holding part 10 is referred to as a "holding reference surface S1". The holding reference surface S1 is a surface (plane) set with reference to the holding part 10. As long as a surface set with reference to the holding part 10 is provided, a surface away from the holding part 10 or an imaginary surface may be used as the holding reference surface S1. Although the holding part 10 is omitted in FIGS. 8 and 9, in the present embodiment, as illustrated in FIGS. 8 and 9, the upper surface of the supported portion 60*a* held by the holding part 10 (an example of the surface away from the holding part 10) is used as the holding reference surface S1. The holding reference surface S1 is designed to be a horizontal plane.

In addition, a reference position of the holding part 10 is referred to as a "holding reference position C1," and a reference position of the transfer target spot 6 is referred to as a "target reference position C2." The holding reference position C1 is a position set with reference to the holding part 10. As long as a position set with reference to the holding part 10 is provided, a position away from the holding part 10 or an imaginary position may be used as the holding reference position C1. The target reference position C2 is a position set with reference to the transfer target spot 6. As long as a position set with reference to the transfer target spot 6 is provided, a position away from the transfer target spot 6 or an imaginary position may be used as the target reference position C2. In the present embodiment, as illustrated in FIGS. 8 and 9, a position on the holding reference surface S1 is defined as the holding reference position C1, and a position on the target reference surface S2 is defined as the target reference position C2.

The holding reference surface S1 and the target reference surface S2 are set such that the holding reference surface S1 and the target reference surface S2 are parallel to each other while the relative positional relationship between the holding part 10 and the transfer target spot 6 is in an ideal state. In addition, the holding reference position C1 and the target reference position C2 are set such that the holding reference position C1 and the target reference position C2 overlap each other in a plan view while the relative positional relationship between the holding part 10 and the transfer target spot 6 is in an ideal state.

As illustrated in FIGS. 4 and 5, in the present embodiment, the detection unit 60 (specifically, the measurement unit 51) includes a distance sensor (for example, a laser distance meter) that measures the distance to the measurement object, as a sensor that measures the relative positional relationship between the holding part 10 and the transfer target spot 6. Specifically, the detection unit 60 includes six distance sensors: a first sensor 61, a second sensor 62, a third sensor 63, a fourth sensor 64, a fifth sensor 65, and a sixth sensor 66.

FIG. 6 schematically illustrates a measurement target of each of the distance sensors (61 to 66). As illustrated in FIG. 6, the first sensor 61 measures an X-direction distance to a surface of the second wall portion 72 perpendicular to the X direction. The second sensor 62 measures a Y-direction distance to a surface of the first wall portion 71 perpendicular to the Y direction, and the third sensor 63 measures a Y-direction distance to a surface of the second wall portion 72 perpendicular to the Y direction. The second sensor 62 and the third sensor 63 are disposed at different positions in the X direction. The fourth sensor 64, the fifth sensor 65, and the sixth sensor 66 measure a Z-direction distance to the upper surface of the plate-shaped portion 73, which is the target reference surface S2. The fourth sensor 64, the fifth sensor 65, and the sixth sensor 66 are disposed at different positions on a surface perpendicular to the Z direction.

FIG. 6 illustrates an ideal state in which the holding part 10 and the transfer target spot 6 maintain a relative positional relationship. In this ideal state, a distance measured by the second sensor 62 and a distance measured by the third sensor 63 are equal to each other. In addition, in this ideal state, a distance measured by the fourth sensor 64, a distance measured by the fifth sensor 65, and a distance measured by the sixth sensor 66 are all equal to each other.

The computation unit 53 obtains an index indicating the relative positional relationship between the holding part 10 and the transfer target spot 6 on the basis of the measurement result of each of the distance sensors (61 to 66), specifically, through calculation (geometric calculation) based on the measurement result of each of the distance sensors (61 to 66). Specifically, the computation unit 53 obtains at least one of an X-direction distance ΔX, a Y-direction distance ΔY, a Z-direction distance ΔZ, a Z-axis turning angle θZ, an X-direction inclination angle θX, and a Y-direction inclination angle θY, as the index indicating the relative positional relationship between the holding part 10 and the transfer target spot 6. Since calculation methods for obtaining the index are clear to those skilled in the art, a detailed description thereof will be omitted.

Figure 7:
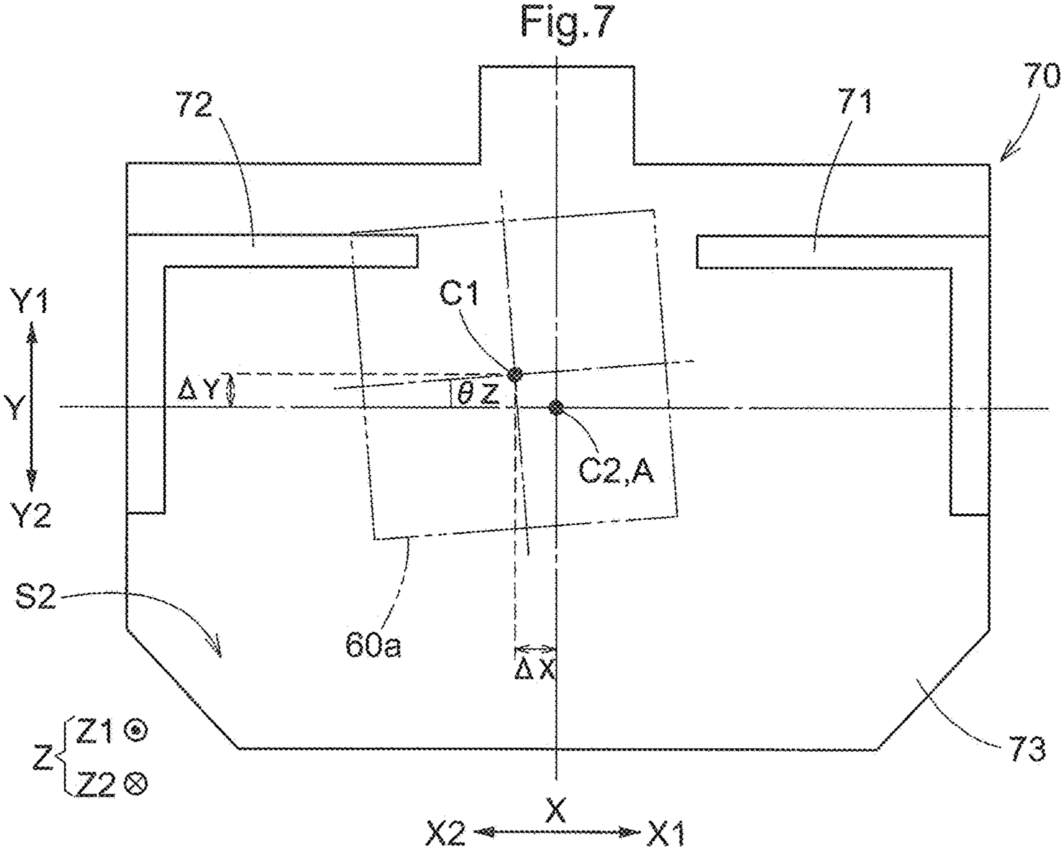
FIG. 7 is an explanatory diagram of an X-direction distance, a Y-direction distance, and a Z-axis turning angle.

FIGS. 7 to 9 illustrate cases where the relative positional relationship between the holding part 10 and the transfer target spot 6 deviates from the ideal state. As illustrated in FIG. 7, the X-direction distance ΔX is an X-direction distance between the holding reference position C1 and the target reference position C2, the Y-direction distance ΔY is a Y-direction distance between the holding reference position C1 and the target reference position C2, and the Z-axis turning angle θZ is a turning angle around a reference axis A along the Z direction between the holding part 10 and the transfer target spot 6. Here, an axis along the Z direction passing through the target reference position C2 is referred to as the reference axis A. In addition, as illustrated in FIGS. 8 and 9, the Z-direction distance ΔZ is a Z-direction distance between the holding reference position C1 and the target reference position C2, the X-direction inclination angle θX is an inclination (in other words, a turning angle about the axis along the Y direction) in the X direction between the holding reference surface S1 and the target reference surface S2, and the Y-direction inclination angle θY is an inclination (in other words, a turning angle about the axis along the X direction) in the Y direction between the holding reference surface S1 and the target reference surface S2.

The above-described teaching is capable of being performed on the basis of the index indicating the relative positional relationship between the holding part 10 and the transfer target spot 6 obtained in this manner. For example, a detection result (computation result) of the index indicating the relative positional relationship between the holding part 10 and the transfer target spot 6 is transmitted from the detection unit 60 to the transport device 1 (specifically, the control unit 30), and the teaching is performed.

Incidentally, oscillation may occur in the index indicating the relative positional relationship between the holding part 10 and the transfer target spot 6. In the present embodiment, a measurement is performed by the measurement unit 51 while the holding part 10 holding the detection unit 60 is lowered to the aforementioned target height by unwinding the windable member 22. Therefore, oscillation may occur in the detection result of the detection unit 60 due to the shaking of the holding part 10 during the measurement by the measurement unit 51. The positional relationship detection system 50 according to the present embodiment includes the configuration described below. This allows for accurately obtaining the center value (that is, the value after the oscillation has ceased) of the oscillation amplitude even in a case where oscillation occurs in the index indicating the relative positional relationship between the holding part 10 and the transfer target spot 6.

Hereinafter, the index for which an average value between the first peak P1 and the second peak P2 is calculated as described below, among the indexes indicating the relative positional relationship between the holding part 10 and the transfer target spot 6, is referred to as the "detection target amount". In the present embodiment, the detection target amount is at least one of the X-direction distance ΔX, the Y-direction distance ΔY, the Z-direction distance ΔZ, the Z-axis turning angle Z, the X-direction inclination angle θX, and the Y-direction inclination angle θY. For indexes other than the detection target amount, average values are capable of being obtained by other methods, such as calculating the average value over the entire period from the start of measurement to the end of measurement. In addition, in a case where the measurement by the measurement unit 51 is performed while the detection unit 60 does not shake, for example, as in a case where the measurement unit 51 is calibrated with the detection unit 60 and the detected unit 70 placed on a calibration carriage, the average value over the entire period from the start of measurement to the end of measurement may also be obtained for the detection target amount.

Figure 10:
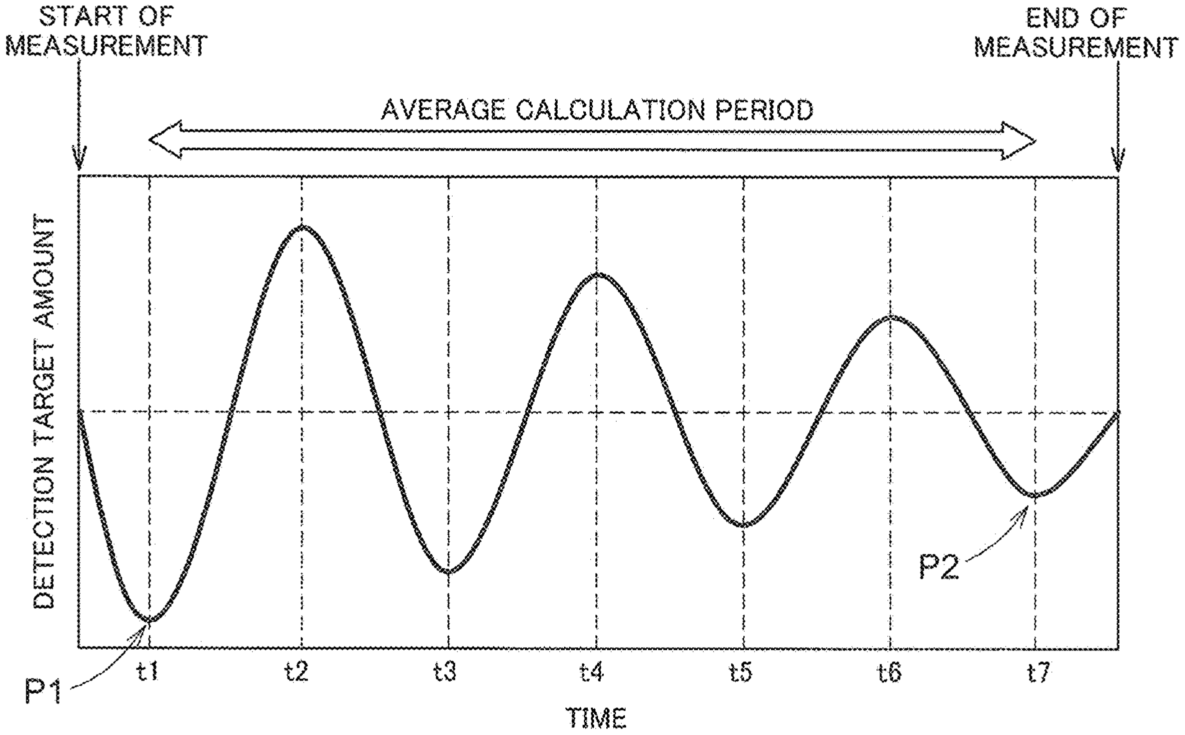
FIG. 10 is a diagram illustrating an example of time-series data of a detection target amount.

FIG. 10 illustrates the time-series data from the start of measurement to the end of measurement for one detection target amount. The recording unit 52 records the measurement data (for example, a plurality of pieces of measurement data acquired at regular time intervals) obtained by the measurement unit 51 in a time series. In the present embodiment, the recording unit 52 records the measurement data continuously (for example, continuously at regular time intervals) for a predetermined setting period. For example, all the measurement data during the setting period are recorded in the recording unit 52. The setting period is, for example, a period (in the example illustrated in FIG. 10, the period from the start of measurement to the end of measurement) until a predetermined measurement time elapses from the start of measurement.

The computation unit 53 acquires target time-series data, which is the time-series data of a specific detection target amount indicating the positional relationship, on the basis of the measurement data recorded by the recording unit 52. In the present embodiment, the computation unit 53 acquires the target time-series data, as illustrated in FIG. 10, by performing calculation (geometric calculation) based on the measurement data recorded by the recording unit 52. The computation unit 53 performs real-time calculation based on the measurement data recorded in the recording unit 52 and displays the acquired value of the detection target amount on a display unit 67 (see FIGS. 4 and 5) provided in the detection unit 60, for example. In the example illustrated in FIG. 10, the detection target amount oscillates to reach valley peaks at times t1, t3, t5, and t7 and mountain peaks at times t2, t4, and t6.

The computation unit 53 identifies a first peak P1 and a second peak P2, which are two of a plurality of peaks of the target oscillation that is the oscillation of the detection target amount appearing in the target time-series data. Both the first peak P1 and the second peak P2 may be either mountain peaks or valley peaks. In the example illustrated in FIG. 10, both the first peak P1 and the second peak P2 are valley peaks. Then, the computation unit 53 obtains the average value of the detection target amounts included in the target time-series data between the first peak P1 and the second peak P2 as a static detection target amount, which is the detection target amount after the target oscillation has ceased. The computation unit 53 obtains, for example, the average value of all the detection target amounts included in the target time-series data between the first peak P1 and the second peak P2 as the static detection target amount. The static detection target amount obtained by the computation unit 53 is displayed on, for example, the display unit 67. In the example illustrated in FIG. 10, the period from the time t1 corresponding to the first peak P1 to the time t7 corresponding to the second peak P2 is set as an average calculation period for obtaining the average value of the detection target amounts. The average value of the detection target amounts is obtained, for example, by dividing the sum of N values of the detection target amounts included in the target time-series data by N.

In the example illustrated in FIG. 10, the number of valley peaks is greater than the number of mountain peaks. Therefore, in the example illustrated in FIG. 10, in a case where the average value of the detection target amounts included in the target time-series data for the entire period from the start of measurement to the end of measurement is obtained, the average value of the detection target amounts will be biased toward a negative side with respect to the center value of the amplitude of the detection target amount. In contrast, by obtaining the average value of the detection target amounts included in the target time-series data between the first peak P1 and the second peak P2 as described above, the number of data points that are skewed to a positive side with respect to the center value of the amplitude and the number of data points that are skewed to the negative side with respect to the center value of the amplitude are capable of being made equal (the same or approximately the same). Accordingly, it is easier to minimize the bias of the average value of the detection target amounts toward either the positive or negative side with respect to the center value of the amplitude. As a result, the accuracy of the static detection target amount derived by the computation unit 53 is easily improved.

Meanwhile, there is a case where the measurement of the positional relationship by the measurement unit 51 is incapable of being normally performed, as in a case where the distance from a distance sensor provided in the measurement unit 51 to a measurement object is outside the measurable range of the distance sensor. In this case, the value of the detection target amount derived by the computation unit 53 may fall outside an assumed detection range (that is, an abnormal value). In view of this point, for example, the computation unit 53 is capable of being configured to use, for the calculation of the average value, all values except for values determined to be abnormal values on the basis of a predetermined determination condition, among values of the detection target amounts included in the target time-series data between the first peak P1 and the second peak P2. The determination condition is, for example, a condition in which a value within the assumed detection range is determined to be a normal value and a value outside the detection range is determined to be an abnormal value. A configuration may be adopted in which the calculation of the average value is performed using an upper limit value of the detection range may be used as the value of a detection target amount exceeding the assumed detection range and using a lower limit value of the detection range may be used as the value of a detection target amount below the assumed detection range. In addition, it is also possible to adopt a configuration in which the calculation of the average value is performed using an estimated value obtained by interpolation or the like as the value of a detection target amount determined to be an abnormal value.

From the viewpoint of increasing the accuracy of the static detection target amount derived by the computation unit 53, it is preferable that one or more peaks (in the example illustrated in FIG. 10, five peaks) are included between the first peak P1 and the second peak P2. In order to secure a large number of peaks included between the first peak P1 and the second peak P2, for example, a configuration may be adopted in which the computation unit 53 identifies the earliest peak in the target time-series data for the setting period (for example, the period from the start of measurement to the end of measurement) as the first peak P1 and identifies the last peak as the second peak P2 (see FIG. 10). The first peak P1 and the second peak P2 may be adjacent peaks. In this case, one of the first peak P1 and the second peak P2 is a mountain peak, and the other is a valley peak.

In the present embodiment, the holding part 10 is lowered from the traveling height to the target height set according to the height of the transfer target spot 6, and then a measurement is performed by the measurement unit 51. In this case, generally, as the lowering amount of the transport object 2 to the transfer target spot 6 is reduced, the cycle of the oscillation of the holding part 10 in a case where the transfer target spot 6 is a measurement target is shortened. In a case where the cycle of the oscillation of the holding part 10 is shortened, the cycle of the oscillation of the detection target amount is also shortened. Therefore, the measurement time of the positional relationship by the measurement unit 51 is capable of being kept short while appropriately securing the number of peaks included in the oscillation of the detection target amount. In view of this point, for example, a configuration may be adopted in which the measurement time of the positional relationship by the measurement unit 51 is set to be shorter according to a decrease in the lowering amount of the transport object 2 to the transfer target spot 6 by the lifting and lowering device 20 (in other words, according to a decrease in the lowering amount of the holding part 10 to the transfer target spot 6 by the lifting and lowering device 20). In this case, for example, the measurement time in a case where the storage shelf (another example of the transfer target spot 6) disposed above (Z1) the load port is a measurement target is set to be shortened than the measurement time in a case where the load port (an example of the transfer target spot 6) of the processing device 5 is a measurement target. The measurement time of the positional relationship by the measurement unit 51 is set to be continuously or stepwise shortened, for example, as the aforementioned lowering amount is reduced.

Figure 11:
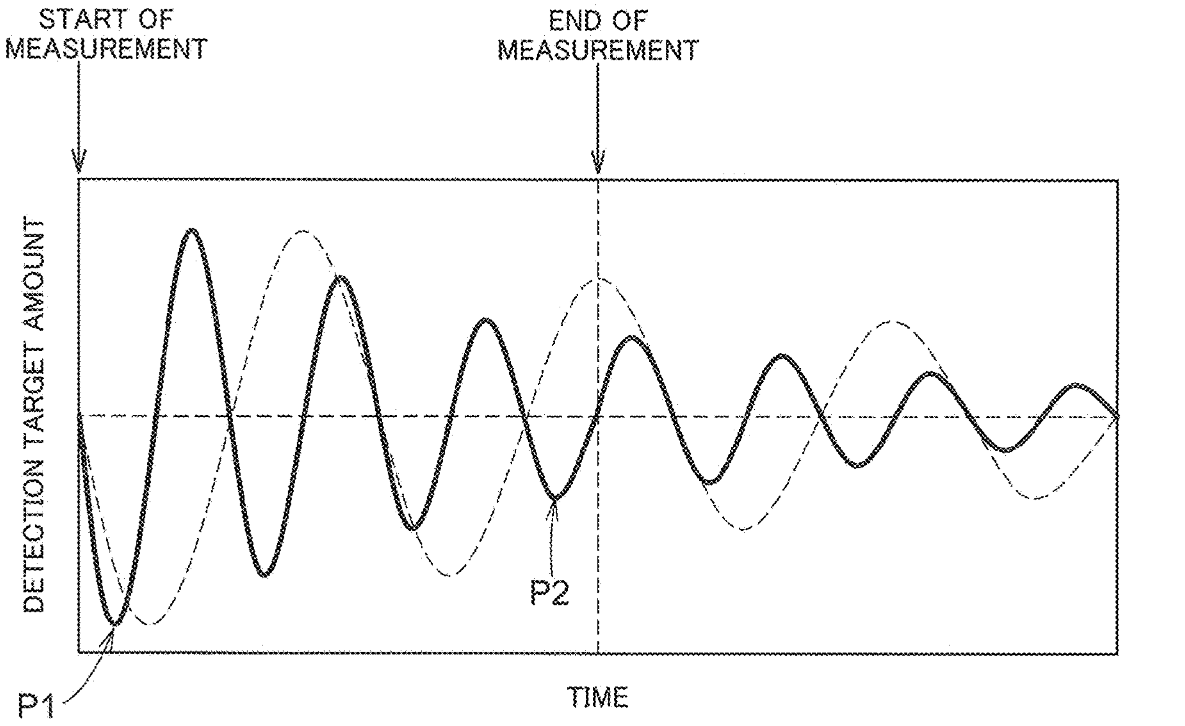
FIG. 11 is a diagram illustrating another example of the time-series data of the detection target amount.

In FIG. 11, the target time-series data in which the cycle of the oscillation of the detection target amount is shorter than that of the target time-series data illustrated in FIG. 10, is indicated by a solid line. In FIG. 11, the target time-series data illustrated in FIG. 10 is indicated by a broken line. In the example illustrated in FIG. 11, the cycle of the oscillation of the detection target amount indicated by the solid line is half the cycle of the oscillation of the detection target amount indicated by the broken line. In this case, even though the measurement time (the time from the start of measurement to the end of measurement) of the positional relationship by the measurement unit 51 is set to half of the measurement time in FIG. 10, the number of peaks included in the oscillation of the detection target amount is capable of being secured to the same extent as in FIG. 10.

Other Embodiments (1) In the above-described embodiment, a configuration in which the measurement unit 51 includes a distance sensor as a sensor that measures the positional relationship has been described as an example. However, the present disclosure is not limited to such a configuration, and it is also possible to adopt a configuration in which the measurement unit 51 includes a sensor (for example, a camera) other than the distance sensor, as the sensor that measures the positional relationship.

(2) In the above-described embodiment, a configuration in which the positioning mechanism 7 that engages with the lower part of the transport object 2 to positions the transport object 2 is provided at the transfer target spot 6 has been described as an example. However, the present disclosure is not limited to such a configuration, and it is also possible to adopt a configuration in which the positioning mechanism 7 is not provided in the transfer target spot 6. A configuration may be adopted in which a mechanism for positioning the transport object 2, different from the positioning mechanism 7, is provided at the transfer target spot 6.

(3) In the above-described embodiment, a configuration in which the holding part 10 holds the transport object 2 from above (Z1) has been described as an example. However, the present disclosure is not limited to such a configuration. For example, it is also possible to adopt a configuration in which the holding part 10 supports the transport object 2 from below (Z2) to hold the transport object 2. In this case, for example, it is also possible to adopt a configuration in which the transport device 1 includes a protruding and retracting device that protrudes or retracts the holding part 10 in the horizontal direction, and the holding part 10 in the protruded state is lowered toward the transfer target spot 6 to transfer the transport object 2 to the transfer target spot 6.

(4) In the above-described embodiment, a configuration in which the transport device 1 is a ceiling transport vehicle that travels along the travel path formed along the ceiling 3 has been described as an example. However, the present disclosure is not limited to such a configuration. The transport device 1 may be a stacker crane or another track-guided transport vehicle or may be a trackless transport vehicle such as an automated guided vehicle (AGV) or an autonomous mobile robot (AMR). In a case where the transport device 1 is the trackless transport vehicle, the transport device 1 travels along a virtually formed travel path, instead of a travel path physically formed using a rail or the like. For example, a plurality of detectable objects, such as two-dimensional codes or radio frequency (RF) tags, is installed on a floor surface, and the travel path is virtually formed to connect the detectable objects. It is also possible to adopt a configuration in which the detectable objects are not provided on the floor surface, and the travel path is virtually formed from a route calculated on the basis of the recognition result of the surrounding environment.

(5) It is also possible to apply the configuration disclosed in the above-described embodiment in combination with the configurations disclosed in other embodiments as long as no contradiction arises (including combinations of the embodiments described as other embodiments). Regarding other configurations, all the embodiments disclosed in the present specification are also merely examples in all respects. Accordingly, it is possible to make various modifications as long as the modifications do not depart from the spirit of the present disclosure.

Summary of Present Embodiment

Hereinafter, the summary of the embodiment related to the positional relationship detection system described above will be provided below.

The positional relationship detection system is a positional relationship detection system that detects a relative positional relationship between a holding part and a transfer target spot in a transport facility including a transport device configured to hold a transport object with the holding part to transport the transport object, and the transfer target spot at which the transport object is transferred by the transport device, the positional relationship detection system comprising a measurement unit configured to measure the positional relationship, a recording unit configured to record measurement data obtained by the measurement unit in a time series, and a computation unit, in which the computation unit acquires target time-series data, which is time-series data of specific detection target amounts indicating the positional relationship, on the basis of the measurement data recorded in the recording unit, identifies a first peak and a second peak that are two of a plurality of peaks of a target oscillation that is an oscillation of the detection target amounts appearing in the target time-series data, and calculates an average value of detection target amounts included in the target time-series data between the first peak and the second peak as a static detection target amount that is a detection target amount after the target oscillation has ceased.

According to the present configuration, when the time average value of the detection target amounts is obtained as the static detection target amount, which is the detection target amount after the oscillation of the detection target amount has ceased, the average value is obtained using the target time-series data between the first peak and the second peak as a target. Thus, the number of data points that are skewed to the positive side with respect to the center value of the amplitude and the number of data points that are skewed to the negative side with respect to the center value of the amplitude, which are included in the target time-series data that is a target for obtaining the average value, are capable of being made equivalent (the same or approximately the same). This makes it easier to suppress the bias of the average value of the detection target amounts to the positive or negative side with respect to the center value of the amplitude. Accordingly, it is easier to improve the accuracy of the static detection target amount derived by the computation unit.

Here, it is preferable that the transport device is configured to lower the holding part toward the transfer target spot and transfer the transport object to the transfer target spot, a direction along an up-down direction is defined as a Z direction, one of directions perpendicular to the Z direction is defined as an X direction, and a direction perpendicular to both the Z direction and the X direction is defined as a Y direction, and the detection target amounts are each at least one of an X-direction distance that is a distance in the X direction between a holding reference position that is a reference position of the holding part and a target reference position that is a reference position of the transfer target spot, a Y-direction distance that is a distance in the Y direction between the holding reference position and the target reference position, a Z-direction distance that is a distance in the Z direction between the holding reference position and the target reference position, a Z-axis turning angle that is a turning angle about a reference axis along the Z direction between the holding part and the transfer target spot, an X-direction inclination angle that is an inclination in the X direction between a holding reference surface that is a reference surface of the holding part and a target reference surface that is a reference surface of the transfer target spot, or a Y-direction inclination angle that is an inclination in the Y direction between the holding reference surface and the target reference surface.

According to the present configuration, in a case where the transport device is configured to lower the holding part toward the transfer target spot and transfer the transport object to the transfer target spot, useful data indicating the relative positional relationship between the holding part and the transfer target spot is capable of being easily obtained with high accuracy.

In the above-described configuration, it is preferable that the transport device includes a lifting and lowering device configured to lift and lower the holding part, the lifting and lowering device includes a rotating body, a windable member wound around the rotating body and configured to be wound and unwound around and from the rotating body, and a lifting and lowering drive motor configured to rotationally drive the rotating body, and is configured to lift and lower the holding part by winding and unwinding the windable member by rotating the rotating body with the holding part suspended by the windable member, and the positional relationship detection system further includes a positioning mechanism disposed at the transfer target spot and engageable with a lower part of the transport object to position the transport object.

In a case where the holding part is lifted and lowered while suspended as in the present configuration, the oscillation of the holding part tends to increase with the lifting and lowering of the holding part. For example, in a case where the measurement unit performs a measurement after the holding part is lowered to a target height set according to the height of the transfer target spot, the oscillation of the holding part tends to increase when the holding part reaches the target height. In such a case, in a case where the measurement by the measurement unit is attempted after the oscillation of the holding part has settled, the measurement takes a long time. Therefore, the detection efficiency of the relative positional relationship between the holding part and the transfer target spot decreases. Regarding this point, according to the technique of the present disclosure, it is possible to obtain the static detection target amount with high accuracy even while the detection target amount is oscillating due to the oscillation of the holding part. Therefore, the technique of the present disclosure is capable of being suitably applied to a configuration in which the holding part is lifted and lowered while suspended.

In the above-described configuration, it is preferable to set a shorter measurement time for the positional relationship by the measurement unit as the lowering amount of the transport object to the transfer target spot by the lifting and lowering device decreases.

For example, in a case where the measurement unit performs a measurement after the holding part is lowered to a target height set according to the height of the transfer target spot, generally, the cycle of the oscillation of the holding part in a case where the transfer target spot is a measurement target is shortened as the lowering amount of the transport object to the transfer target spot decreases. In a case where the cycle of the oscillation of the holding part is shortened, the cycle of the oscillation of the detection target amount is also shortened. Therefore, the measurement time of the positional relationship by the measurement unit is capable of being kept short while appropriately securing the number of peaks included in the target oscillation. In view of this point, according to the present configuration, the measurement time of the positional relationship by the measurement unit is set to be short as the lowering amount of the transport object to the transfer target spot decreases. Therefore, the time required for the measurement by the measurement unit is capable of being kept short within a range in which the first peak and the second peak are capable of being appropriately identified, and the time required to obtain the static detection target amount is capable of being shortened.

In the positional relationship detection system of each of the configurations, it is preferable that the recording unit records the measurement data continuously for a predetermined period, and the computation unit identifies an earliest peak in the target time-series data for the predetermined period as the first peak and a last peak in the target time-series data for the predetermined period as the second peak.

According to the present configuration, the average value of the detection target amount is capable of being obtained by utilizing the measurement data recorded in the recording unit to the maximum extent. Accordingly, it is easier to increase the accuracy of the static detection target amount derived by the computation unit.

In addition, it is preferable that the computation unit uses, for the calculation of the average value, all of respective values excluding any value determined to be an abnormal value based on determination condition, among values of the detection target amounts included in the target time-series data between the first peak and the second peak.

With the present configuration, abnormal values are removed from the values of the detection target amounts included in the target time-series data between the first peak and the second peak, and all values other than the abnormal values are used for the calculation of the average value. This allows the accuracy of the static detection target amount derived by the computation unit to be further improved.

The positional relationship detection system according to the present disclosure may exhibit at least one of the above-described effects.

What is claimed is:

1. A positional relationship detection system that detects a relative positional relationship between a holding part and a transfer target spot in a transport facility comprising a transport device configured to hold a transport object with the holding part to transport the transport object, and the transfer target spot at which the transport object is transferred by the transport device, the positional relationship detection system comprising:

- a measurement unit configured to measure the positional relationship;
- a recording unit configured to record measurement data obtained by the measurement unit in a time series; and
- a computation unit, and
- wherein the computation unit:
  - acquires target time-series data, which is time-series data of specific detection target amounts indicating the positional relationship, on the basis of the measurement data recorded in the recording unit,
  - identifies a first peak and a second peak that are two of a plurality of peaks of a target oscillation that is an oscillation of the detection target amounts appearing in the target time-series data, and
  - calculates an average value of detection target amounts included in the target time-series data between the first peak and the second peak as a static detection target amount that is a detection target amount after the target oscillation has ceased.

2. The positional relationship detection system according to claim 1, wherein:

- the transport device is configured to lower the holding part toward the transfer target spot and transfer the transport object to the transfer target spot,
- a direction along an up-down direction is defined as a Z direction, one of directions perpendicular to the Z direction is defined as an X direction, and a direction perpendicular to both the Z direction and the X direction is defined as a Y direction, and
- the detection target amounts are each at least one of:
  - an X-direction distance that is a distance in the X direction between a holding reference position that is a reference position of the holding part and a target reference position that is a reference position of the transfer target spot,
  - a Y-direction distance that is a distance in the Y direction between the holding reference position and the target reference position,
  - a Z-direction distance that is a distance in the Z direction between the holding reference position and the target reference position,
  - a Z-axis turning angle that is a turning angle about a reference axis along the Z direction between the holding part and the transfer target spot,
  - an X-direction inclination angle that is an inclination in the X direction between a holding reference surface that is a reference surface of the holding part and a target reference surface that is a reference surface of the transfer target spot, or
  - a Y-direction inclination angle that is an inclination in the Y direction between the holding reference surface and the target reference surface.

3. The positional relationship detection system according to claim 2, wherein:

- the transport device comprises a lifting and lowering device configured to lift and lower the holding part,
- the lifting and lowering device comprises a rotating body, a windable member wound around the rotating body and configured to be wound and unwound around and from the rotating body, and a lifting and lowering drive motor configured to rotationally drive the rotating body, and is configured to lift and lower the holding part by winding and unwinding the windable member by rotating the rotating body with the holding part suspended by the windable member, and
- the positional relationship detection system further comprises:
  - a positioning mechanism disposed at the transfer target spot and engageable with a lower part of the transport object to position the transport object.

4. The positional relationship detection system according to claim 1,

- wherein the recording unit records the measurement data continuously for a predetermined period, and
- wherein the computation unit identifies an earliest peak in the target time-series data for the predetermined period as the first peak and a last peak in the target time-series data for the predetermined period as the second peak.

5. The positional relationship detection system according to claim 1,

- wherein the computation unit uses, for the calculation of the average value, all of respective values excluding any value determined to be an abnormal value based on determination condition, among values of the detection target amounts included in the target time-series data between the first peak and the second peak.

* * * * *